(12) United States Patent
Sakuma

(10) Patent No.: US 7,599,207 B2
(45) Date of Patent: Oct. 6, 2009

(54) SEMICONDUCTOR MEMORY DEVICE

(75) Inventor: Shinzo Sakuma, Tokyo (JP)

(73) Assignee: Oki Semiconductor Co., Ltd., Tokyo (JP)

(*) Notice: Subject to any disclaimer, the term of this patent is extended or adjusted under 35 U.S.C. 154(b) by 21 days.

(21) Appl. No.: 11/711,752

(22) Filed: Feb. 28, 2007

(65) Prior Publication Data

US 2007/0206433 A1 Sep. 6, 2007

(30) Foreign Application Priority Data

Mar. 2, 2006 (JP) ............................. 2006-056665

(51) Int. Cl.
*G11C 11/22* (2006.01)
(52) U.S. Cl. .................... 365/145; 365/49.12
(58) Field of Classification Search ................ 365/145, 365/49.12
See application file for complete search history.

(56) References Cited

U.S. PATENT DOCUMENTS 7,120,042 B2 10/2006 Takahashi
7,274,608 B2 * 9/2007 Takahashi ................... 365/200

FOREIGN PATENT DOCUMENTS

JP 10-79196 3/1998
JP 2004-234788 8/2004

* cited by examiner

*Primary Examiner*—Hoai V Ho
*Assistant Examiner*—Fernando N Hidalgo
(74) *Attorney, Agent, or Firm*—Volentine & Whitt, P.L.L.C.

(57) ABSTRACT

A ferroelectric memory cell array has 1T/1C memory cells disposed in matrix form. An address storage unit stores threshold memory addresses for dividing the array into a first block for causing each memory cell to store one-bit data for each memory cell and a second block for causing each memory cell pair to store one-bit data for each memory cell pair. An address comparator compares column addresses corresponding to memory addresses with the threshold memory addresses and determines whether each of the memory addresses belongs to either the first or second blocks. An address switching unit controls drivers so that when it is determined that the memory address belongs to the first block, only corresponding word and plate lines are activated and when it is determined that the memory address belongs to the second block, only corresponding word and plate line pairs are activated.

9 Claims, 7 Drawing Sheets

SEMICONDUCTOR MEMORY DEVICE

BACKGROUND OF THE INVENTION

The present invention relates to a semiconductor memory device such as a ferroelectric memory.

As a semiconductor memory device, for example, a ferroelectric memory has been known. The ferroelectric memory is of a memory which records binarized data using polarization of each ferroelectric capacitor. As a document that has disclosed the structure and principle of a ferroelectric memory, there is known, for example, a non-patent document 1 (Katsuro Fukamizu, "Low-Power Consumption High-Speed LSI technology", REALIZE INC., Jan. 31, 1998). As described in the non-patent document 1, one of 1T/1C type and one of 2T/2C type are known as ferroelectric memories.

In the 1T/1C type ferroelectric memory, one memory cell is constituted of a transistor and a ferroelectric capacitor. A stored value is determined or judged by comparing the potential read from the ferroelectric capacitor with a reference potential.

On the other hand, in the 2T/2C type ferroelectric memory, one memory cell is constituted of two transistors and two ferroelectric capacitors. Values "1" and "0" are stored in the two ferroelectric capacitors on a complementary basis. And the stored value is determined by detecting the relationship between the magnitudes of potentials respectively read from the two ferroelectric capacitors.

In the ferroelectric memory, the read potential changes with time when data is stored therein over a long period. FIG. 7 is a graph showing changes in read potential with time. As shown in FIG. 7, a high level V1 of a read potential is lowered and a low level V0 thereof rises with deterioration of a ferroelectric capacitor.

As described above, the 1T/1C type ferroelectric memory compares the read potential V0 or V1 with the reference potential Vref. On the other hand, the 2T/2C type ferroelectric memory compares the read potential V0 and the read potential V1. Thus, the 2T/2C type ferroelectric memory is greater in read margin than the 1T/1C type ferroelectric memory (see FIG. 7).

Thus, the 2T/2C type ferroelectric memory has the advantage that the reliability of stored data over an extended period of time is easy to ensure as compared with the 1T/1C type ferroelectric memory.

On the other hand, the 1T/1C type ferroelectric memory has the merit that since each memory cell is small in circuit scale, high integration is easy. Further, the 1T/1C type ferroelectric memory also has the merit that it is higher or greater in operating speed than the 2T/2C type ferroelectric memory. When, for example, the ferroelectric memory is used as an alternative to a volatile memory such as an SRAM (Static Random Access Memory) (that is, when it is used for temporary storage of data), the reliability of stored data over an extended period of time is not required.

Thus, as the ferroelectric memory, the 2T/2C type is desirable in applications that require long-term reliability. However, there are often cases in which the 1T/1C type is desirable in applications that no require such reliability. Due to such reasons, there has been proposed such a ferroelectric memory as to be usable as the 1T/1C type and the 2T/2C type according to the applications (refer to a patent document 1 (Japanese Unexamined Patent Publication No. Hei 10(1998)-79196)). In the ferroelectric memory disclosed in the patent document 1, the 1T/1C type and the 2T/2C type can be switched by causing a user or vendor to set the potential of each mode signal (refer to, for example, the paragraphs 0042 and 0046 in the same patent document).

In the ferroelectric memory of the patent document 1, however, all memory cells contained in a memory cell block are set to either the 1T/1C type or the 2T/2C type (refer to, for example, the paragraph 0029 in the same patent document). That is, in the ferroelectric memory according to the patent document 1, one memory cell block cannot be used with being divided into a 1T/1C type block and a 2T/2C type block. Besides, the ferroelectric memory of the patent document 1 needs terminals for inputting the mode signals and thereby makes it difficult to perform a reduction in the area of each element.

A ferroelectric memory in which both 1T/1C and 2T/2C types are formed within one chip, has been disclosed in a patent document 2 (Specification of Japanese Patent No. 3592321). The ferroelectric memory of the patent document 2 is provided with 1T/1C type data memory cells and 2T/2C type testing memory cells. However, the ferroelectric memory of the patent document 2 is not capable of switching each data memory cell to the 2T/2C type.

SUMMARY OF THE INVENTION

With the foregoing problems in view, it is therefore an object of the present invention to provide a semiconductor memory device which is capable of using one memory block provided in one chip in the form of being arbitrarily divided into a 1T/1C type area and a 2T/2C type area and requires no signal terminals for switching 1T/1C and 2T/2C types.

According to one aspect of the present invention, for attaining the above object, there is provided a semiconductor memory device comprising a memory cell array in which a plurality of memory cells each constituted of a capacitor and a transistor connected to the capacitor are arranged in matrix form, a plurality of word lines respectively connected to the memory cells disposed in a column direction, a plurality of bit line pairs respectively connected to the memory cells disposed in a row direction, a word line driver that selectively activates the word lines, an address storage unit that stores therein threshold memory addresses for dividing the memory cell array into a first block for causing each memory cell to store data of one bit for each memory cell and a second block for causing one pair of memory cells to store data of one bit for each pair of memory cells, an address comparing unit that determines whether each of memory addresses for specifying the memory cells to be accessed belongs to either of the first and second blocks by comparison with the threshold memory addresses stored in the address storage unit, and an address switching unit that controls the word line driver in such a manner that when it is determined that the memory address for specifying each memory cell to be accessed belongs to the first block, the corresponding one word line is activated and when it is determined that the memory address belongs to the second block, the corresponding one pair of word lines is activated.

According to the present invention, memory addresses (hereinafter called read/write memory addresses) for specifying memory cells to be accessed for the purpose of reading and writing of data, and threshold memory addresses are compared, thereby discriminating between a 1T/1C type memory cell block (i.e., a first memory block) and a 2T/2C type memory cell block (i.e., a second memory block). When the read/write memory addresses correspond to the 1T/1C type memory cell block, only one word line is activated.

When the read/write memory addresses correspond to the 2T/2C type memory cell block, a pair of word lines is activated.

Thus, in the present invention, one memory block provided in one chip can be used with being arbitrarily divided into the 1T/1C and 2T/2C types.

Further, in the present invention, the boundary between the 1T/1C type memory cell block and the 2T/2C type memory cell block is set by values (threshold memory addresses) stored in the address storage unit. Therefore, dedicated signal terminals for performing switching between the 1T/1C and 2T/2C types are not required.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 3 is a conceptual diagram for describing the operation of the ferroelectric memory according to the first embodiment;

DETAILED DESCRIPTION OF THE PREFERRED EMBODIMENTS

Preferred embodiments of the present invention will hereinafter be described using the accompanying drawings. Incidentally, the size, shape and layout or physical relationship of each constituent element or component in the figures are merely approximate illustrations to enable an understanding of the present invention. Numerical conditions to be described below are nothing more than mere preferred examples.

First Preferred Embodiment

Figure 3:
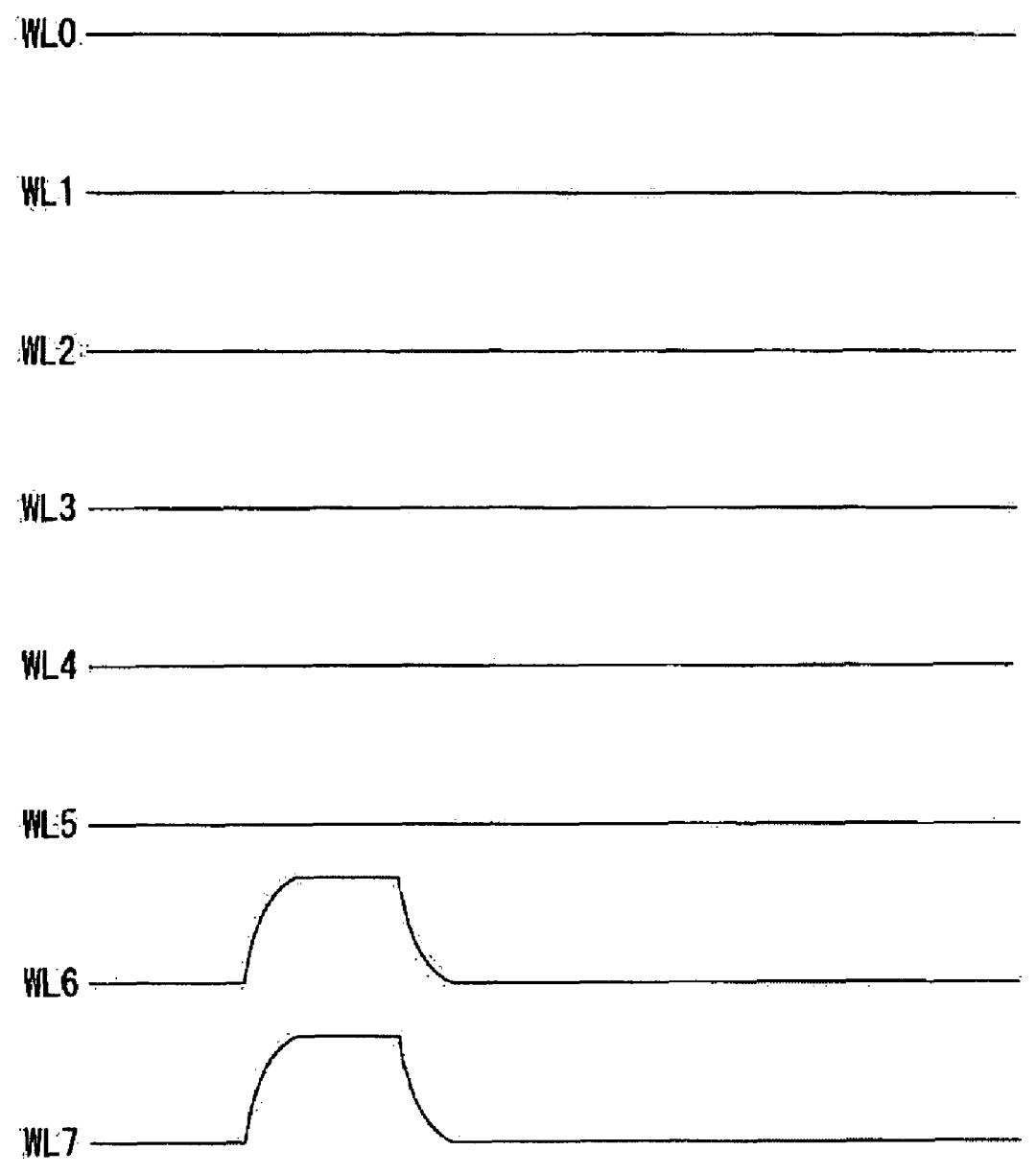

A first embodiment will be explained below using FIGS. 1 through 3.

Figure 1:
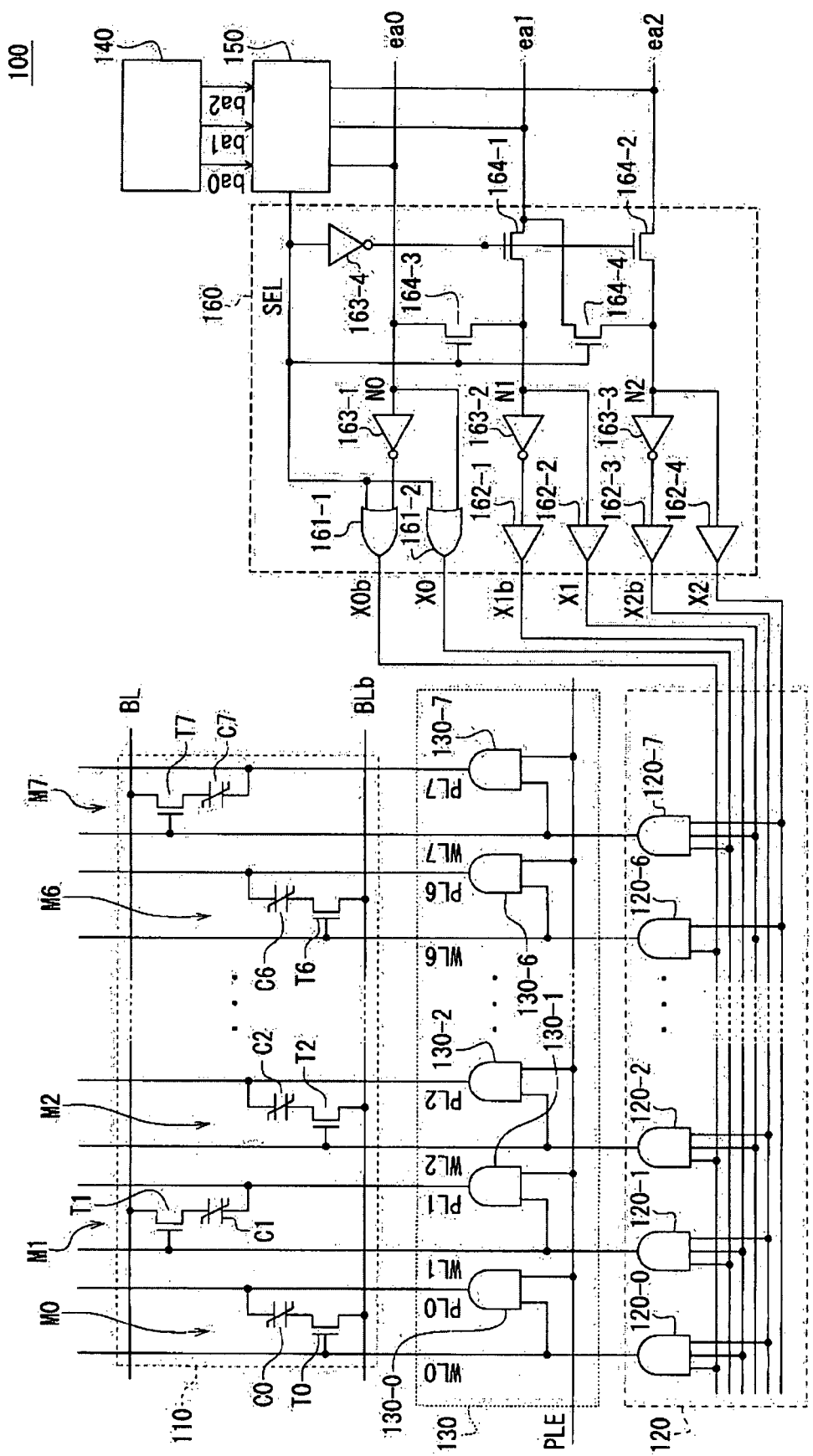
FIG. 1 is a circuit diagram showing an essential configuration of a ferroelectric memory according to a first embodiment.
Figure 2:
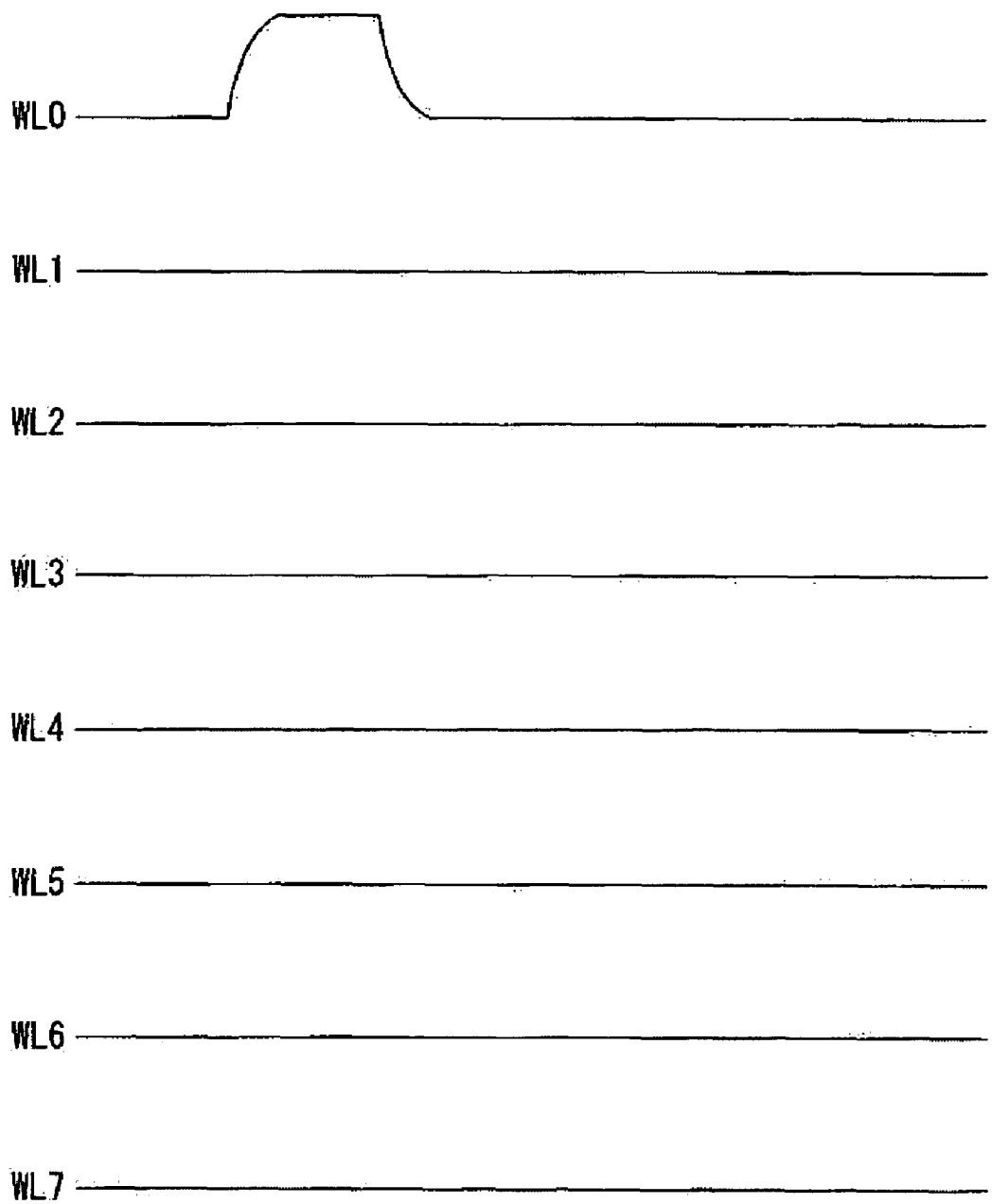
FIG. 2 is a conceptual diagram for describing the operation of the ferroelectric memory according to the first embodiment.

FIG. 1 is a circuit diagram showing an essential configuration of a ferroelectric memory according to the present embodiment.

As shown in FIG. 1, the ferroelectric memory 100 according to the present embodiment includes a memory cell array 110, a word line driver 120, a plate line driver 130, an address memory or storage unit 140, an address comparator or comparing unit 150 and an address selector or switching unit 160.

The memory cell array 110 is provided with memory cells M0 through M7 arranged in the form of one row and eight columns. Incidentally, although the memory cells are illustrated by one row in the example of FIG. 1 for simplification of explanation, two or more rows may of course be configured. Each of the memory cells M0 through M7 includes one switch transistor and one ferroelectric capacitor. The switch transistors T0 through T7 have one ends alternately connected to bit lines BL and BLb and gates each connected to any of word lines WL0 through WL7. The ferroelectric capacitors C0 through C7 have one ends connected to the other ends of their corresponding switch transistors, and the other ends each connected to any of the plate lines PL0 through PL7. Thus, each of the memory cells M0 through M7 is of a 1T/1C type.

The word line driver 120 is provided with eight 3-input AND circuits 120-0 through 120-7. The word line driver 120 is inputted with three pairs of control signals (X0, X0b), (X1, X1b) and (X2, X2b) from the address switching unit 160. Signal line pairs for these control signals are respectively inputted to the AND circuits 120-0 through 120-7 in increments of ones thereof. The AND circuits 120-0 through 120-7 activate their corresponding word lines only when all of the input signals are a high level (source voltage level). In the present embodiment, the high level is defined as an activated level.

The plate line driver 130 is provided with eight two-input AND circuits 130-0 through 130-7. Each of the AND circuits 130-0 through 130-7 is inputted with a plate enable signal PLE from one input terminal thereof and inputted with a potential of its corresponding word line from the other input terminal thereof. That is, the AND circuits 130-0 through 130-7 activate their corresponding plate lines only when the plate enable signal PLE is of a high level and the potentials of their corresponding word lines are high in level.

The address storage unit 140 stores threshold memory addresses (ba2, ba1 and ba0) therein. The threshold memory addresses are memory addresses indicative of the boundaries at the time that the memory cell array 110 is divided into blocks (i.e., each corresponding to a 1T/1C type block) for causing each memory cell to store data of one bit for each memory cell, and blocks (i.e., each corresponding to a 2T/2C type block) for causing each pair of memory cells to store data of one bit for each pair of memory cells. The address storage unit 140 may preferably be constituted of a rewritable or reprogrammable memory such as a register. This is because if the threshold memory addresses can be freely changed, then a user is able to freely change a storage capacity ratio between the 1T/1C type block and the 2T/2C type block.

The address comparator 150 compares read/write memory addresses (ea2, ea1 and ea0) inputted from outside and the threshold memory addresses (ba2, ba1 and ba0). Then, the address comparator 150 outputs a signal SEL indicative of the result of comparison. In the present embodiment, a signal SEL at the time that each of the read/write memory addresses (ea2, ea1 and ea0) corresponds to the 1T/1C type block, is assumed to be a low level (ground voltage level), and a signal SEL at that time that each of the read/write memory addresses (ea2, ea1 and ea0) corresponds to the 2T/2C type block is assumed to be a high level.

The address switching unit 160 is inputted with the signal SEL and the read/write memory addresses (ea2, ea1 and ea0). The address switching unit 160 converts the read/write memory addresses (ea2, ea1 and ea0) into their corresponding control signals (X0b, X0), (X1b, X1) and (X2b, X2) based on the value of the signal SEL. Thus, when the signal SEL is low in level, the address switching unit 160 activates one word line corresponding to the read/write memory addresses (ea2, ea1 and ea0). When the signal SEL is high in level, the address switching unit 160 controls the word line driver 120 in such a manner that a pair of word lines corresponding to the read/write memory addresses is activated.

The address switching unit 160 includes two-input OR circuits 161-1 and 161-2, buffers 162-1 through 162-4, inverters 163-1 through 163-4 and transistors 164-1 through 164-4. When the signal SEL is low in level, the OR circuit 161-1 outputs an inverted potential of a potential (i.e., potential of memory address signal ea0) of a node N0. When the signal SEL is high in level, the OR circuit 161-1 outputs a high level as the control signal X0b. When the signal SEL is low in level, the OR circuit 161-2 outputs the potential of the node N0. When the signal SEL is high in level, the OR circuit 161-2 outputs a high level as the control signal X0. The buffer 162-1 outputs an inverted potential of a potential at a node N1 as the control signal X1b. The buffer 162-2 outputs the potential of the node N1 as the control signal X1. The buffer 162-3 outputs an inverted potential of a potential at a node N2 as the control signal X2b. The buffer 162-4 outputs the potential at the node N2 as the control signal X2. The inverters 163-1 through 163-3 invert the potentials of the nodes N0 through N2. The inverter 163-4 inverts the signal SEL and supplies the same to the gates of the transistors 164-1 and 164-2. The transistor 164-1 supplies the memory address signal ea1 to the node N1 when the signal SEL is low in level, and is turned off when the signal SEL is high in level. The transistor 164-2 supplies the memory address signal ea2 to the node N2 when the signal SEL is low in level, and is turned off when the signal SEL is high in level. The transistor 164-3 supplies the memory address signal ea0 to the node N1 when the signal SEL is high in level, and is turned off when the signal SEL is low in level. The transistor 164-4 supplies the memory address signal ea1 to the node N2 when the signal SEL is high in level, and is turned off when the signal SEL is low in level.

The entire operation of the ferroelectric memory 100 according to the present embodiment will next be explained using FIGS. 2 and 3.

Description will be made below as an example, of a case in which each of the memory cells M0 through M3 is used as the 1T/1C type and each of the memory cells M4 through M7 is used as the 2T/2C type.

(ba2, ba1, ba0)=(1, 0, 0) are stored in the address storage unit 140 as threshold memory addresses in advance.

The operation of the 1T/1C type memory cell will first be explained with the memory cell M0 taken as an example.

Read/write memory addresses (ea2, ea1 and ea0) are first inputted from outside. The address comparator 150 compares the read/write memory addresses with the threshold memory addresses (ba2, ba1 and ba0). Here, (ea2, ea1, ea0)=(0, 0, 0) and (ba2, ba1, ba0)=(1, 0, 0). Thus, the read/write memory addresses are smaller than the threshold memory addresses. In this case, the address comparator 150 outputs a low level as a signal SEL. Thus, in the address switching unit 160, the transistors 164-1 and 164-2 are turned on and the transistors 164-3 and 164-4 are turned off. Therefore, the potential at the node N1 coincides with ea1 and the potential at the node N2 coincides with ea2. When the signal SEL is low in level as described above, the OR circuit 161-1 outputs an inverted potential of a potential at the node N0, and the OR circuit 161-2 outputs the potential at the node N0. Accordingly, when the read/write memory addresses are given as (0, 0, 0), their corresponding control signals result in (X0b, X0, X1b, X1, X2b, X2)=(1, 0, 1, 0, 1, 0).

These control signals are transmitted to the word line driver 120. Thus, only the AND circuit 120-0 inputted with X0b, X1b and X2b outputs a high level, whereas other AND circuits 120-1 through 120-7 output a low level respectively. Accordingly, the word line WL0 is activated and other word lines WL1 through WL7 are deactivated (see FIG. 2).

Thus, the AND circuit 130-0 of the plate line driver 130 outputs a high level when the plate enable signal PLE reaches a high level. On the other hand, other AND circuits 130-1 through 130-7 are respectively held at a low level. That is, the plate line PL0 is activated and other plate lines PL1 through PL7 are not activated.

With the activation of the word line WL0, the switch transistor T0 of the memory cell M0 is turned on. Accordingly, the plate line PL0 and its corresponding bit line BLb are connected to each other via the ferroelectric capacitor C0. Thus, reading or writing can be effected on the ferroelectric capacitor C0. In the case of reading, for example, data read into the bit line BLb is compared with a reference voltage as conventional and read out as '1' or '0'.

On the other hand, since the switch transistors T1 through T7 are not turned on with respect to other memory cells M1 through M7, no reading or writing is performed.

When the read/write memory addresses are smaller than the threshold memory addresses (1, 0, 0) as described above, the corresponding ferroelectric memory cell is used as the 1T/1C type memory cell.

The operation of the 2T/2C type memory cell will next be explained with the memory cell M7 taken as an example.

Read/write memory addresses (ea2, ea1 and ea0) are first inputted from outside. The address comparator 150 compares the read/write memory addresses with the threshold memory addresses (ba2, ba1 and ba0). Here, assume that (ea2, ea1, ea0)=(1, 1, 1). In a manner similar to the above description of operation, (ba2, ba1, ba0)=(1, 0, 0). Thus, the read/write memory addresses are larger than the threshold memory addresses. Therefore, the address comparator 150 outputs a high level as a signal SEL. Thus, in the address switching unit 160, the transistors 164-1 and 164-2 are turned off and the transistor 164-3 and 164-4 are turned on. Therefore, the potential at the node N1 coincides with ea0 and the potential at the node N2 coincides with ea1. When the signal SEL is high in level as mentioned above, the OR circuits 161-1 and 161-2 output a high level. Accordingly, when the read/write memory addresses are given as (1, 1, 1), their corresponding control signals result in (X0b, X0, X1b, X1, X2b, X2)=(1, 1, 0, 1, 0, 1).

These control signals are transmitted to the word line driver 120. Thus, the AND circuit 120-6 inputted with X0b, X1 and X2 and the AND circuit 120-7 inputted with X0, X1 and X2 output a high level respectively, whereas other AND circuits 120-1 through 120-7 output a low level respectively. Accordingly, the word lines WL6 and WL7 are activated and other word lines WL0 through WL5 are deactivated (see FIG. 3).

The AND circuits 130-6 and 130-7 of the plate line driver 130 outputs a high level when the plate enable signal PLE reaches a high level. On the other hand, other AND circuits 130-0 through 130-5 are respectively held at a low level. That is, the plate lines PL6 and PL7 are activated and other plate lines PL0 through PL5 are not activated.

With the activation of the word lines WL6 and WL7, the switch transistors T6 and T7 of the memory cells M6 and M7 are turned on. Accordingly, the plate line PL6 and the bit line BLb are connected to each other via the ferroelectric capacitor C6. Further, the plate line PL7 and the bit line BL are connected to each other via the ferroelectric capacitor C7. Thus, reading or writing can be effected on the ferroelectric capacitors C6 and C7. In the case of reading, for example, the potentials of the bit lines BL and BLb are compared and the result of comparison is read out as '1' or '0'.

On the other hand, since the switch transistors T0 through T5 are not turned on with respect to other memory cells M0 through M5, no reading or writing is carried out.

Thus, when the read/write memory addresses are greater than the threshold memory addresses (1, 0, 0), the corresponding ferroelectric memory cells are used as the 2T/2C type memory cells. Incidentally, when the read/write memory addresses coincident with the threshold memory addresses are inputted, it is determined in advance whether a memory cell corresponding to the read/write memory addresses is used as the 1T/1C type or 2T/2C type. It is determined whether the select signal SEL should be rendered high or low in level depending on the result of determination. Consequently, adaptation to the above input can be performed.

According to the present embodiment as described above, one memory block provided in one ferroelectric memory 100 can be used with being arbitrarily divided into the 1T/1C type and 2T/2C type. Further, the signal terminals for switching the 1T/1C type and the 2T/2C type are not necessary.

Second Preferred Embodiment

A second embodiment will be explained below using FIG. 4. A ferroelectric memory according to the present embodiment is different from that according to the first embodiment in that it is provided with an error correcting function.

Figure 4:
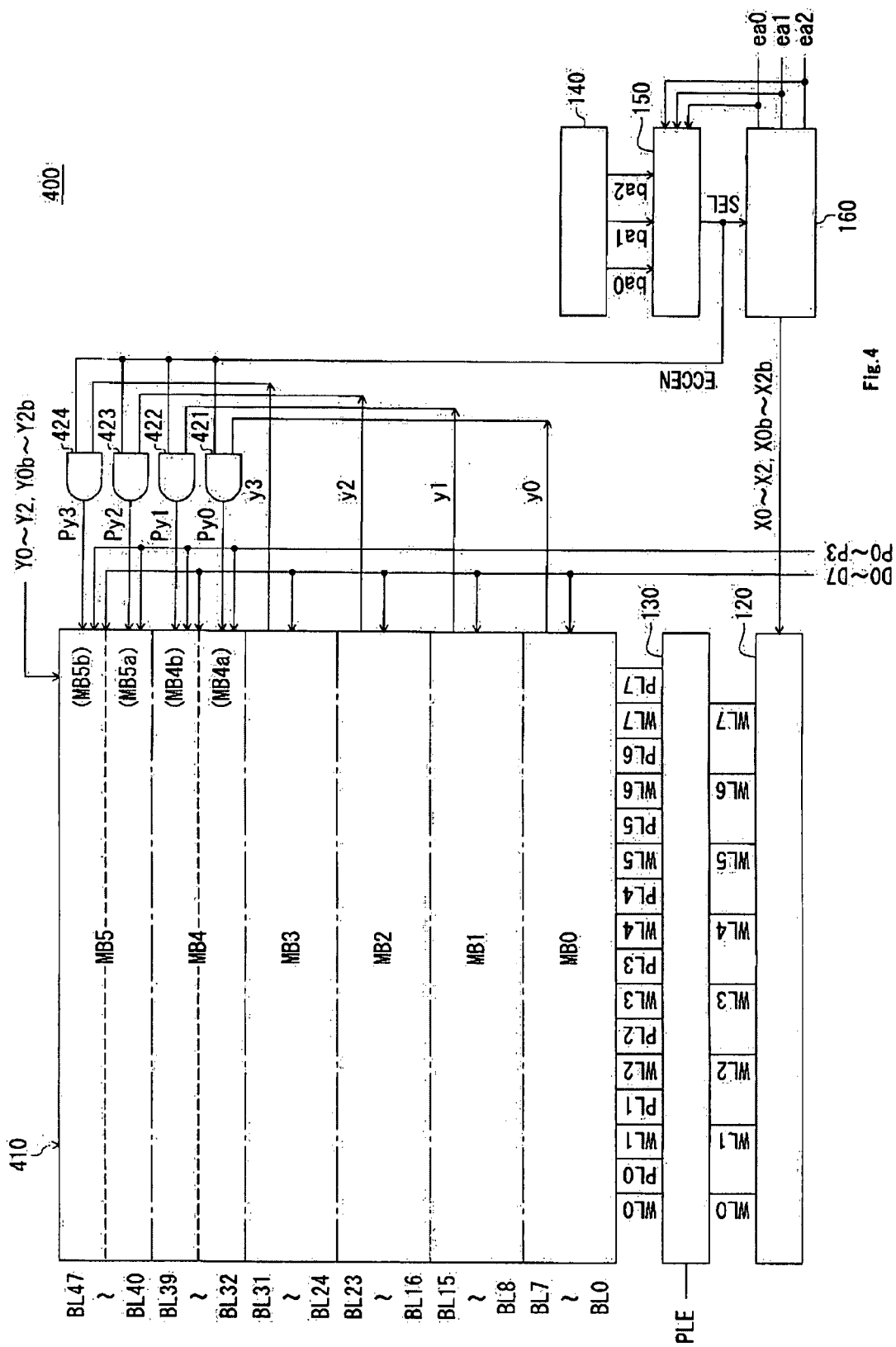
FIG. 4 is a circuit diagram showing an essential configuration of a ferroelectric memory according to a second embodiment.
Figure 5:
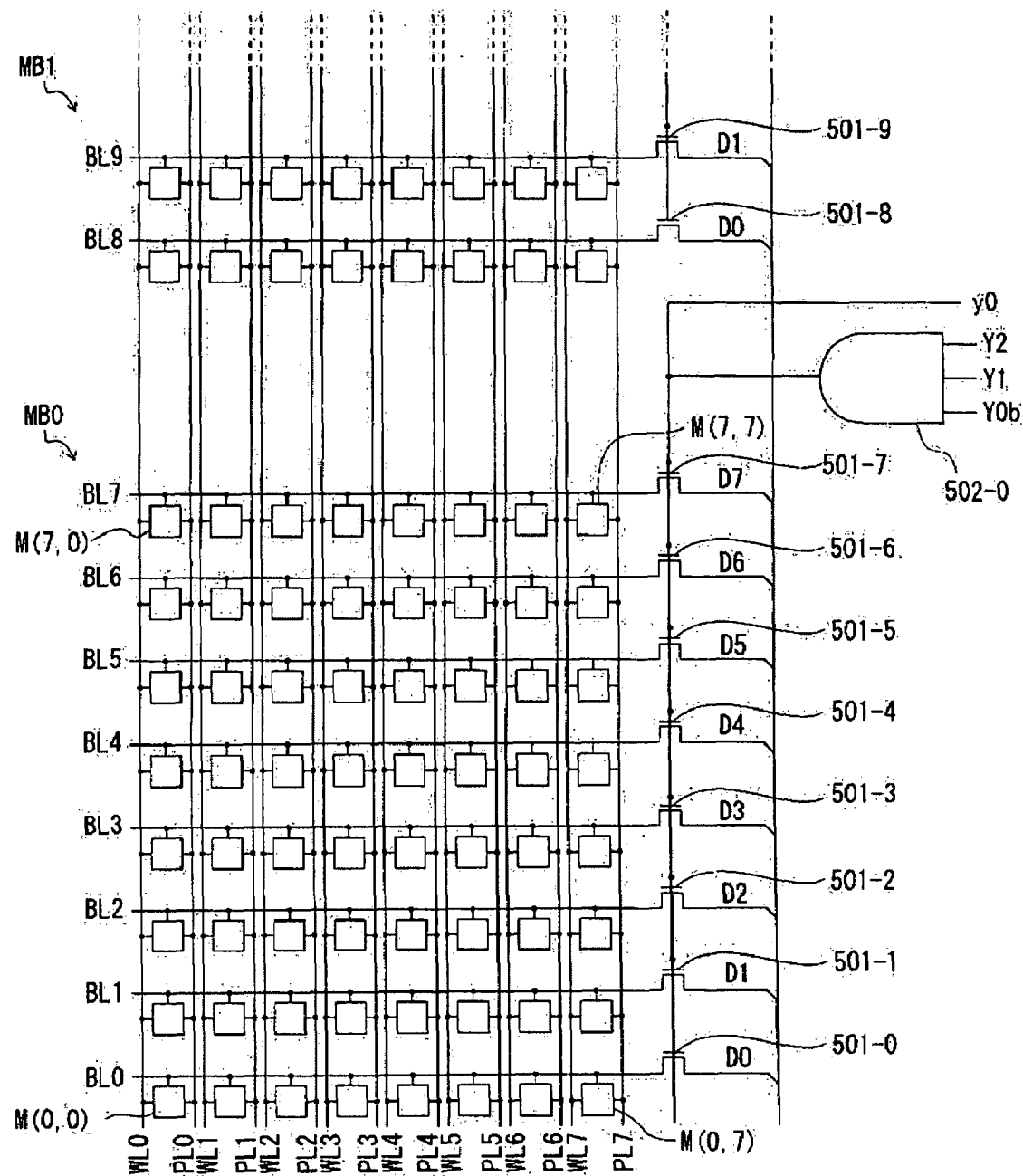
FIG. 5 is a circuit diagram illustrating an essential configuration of the ferroelectric memory according to the second embodiment.
Figure 6:
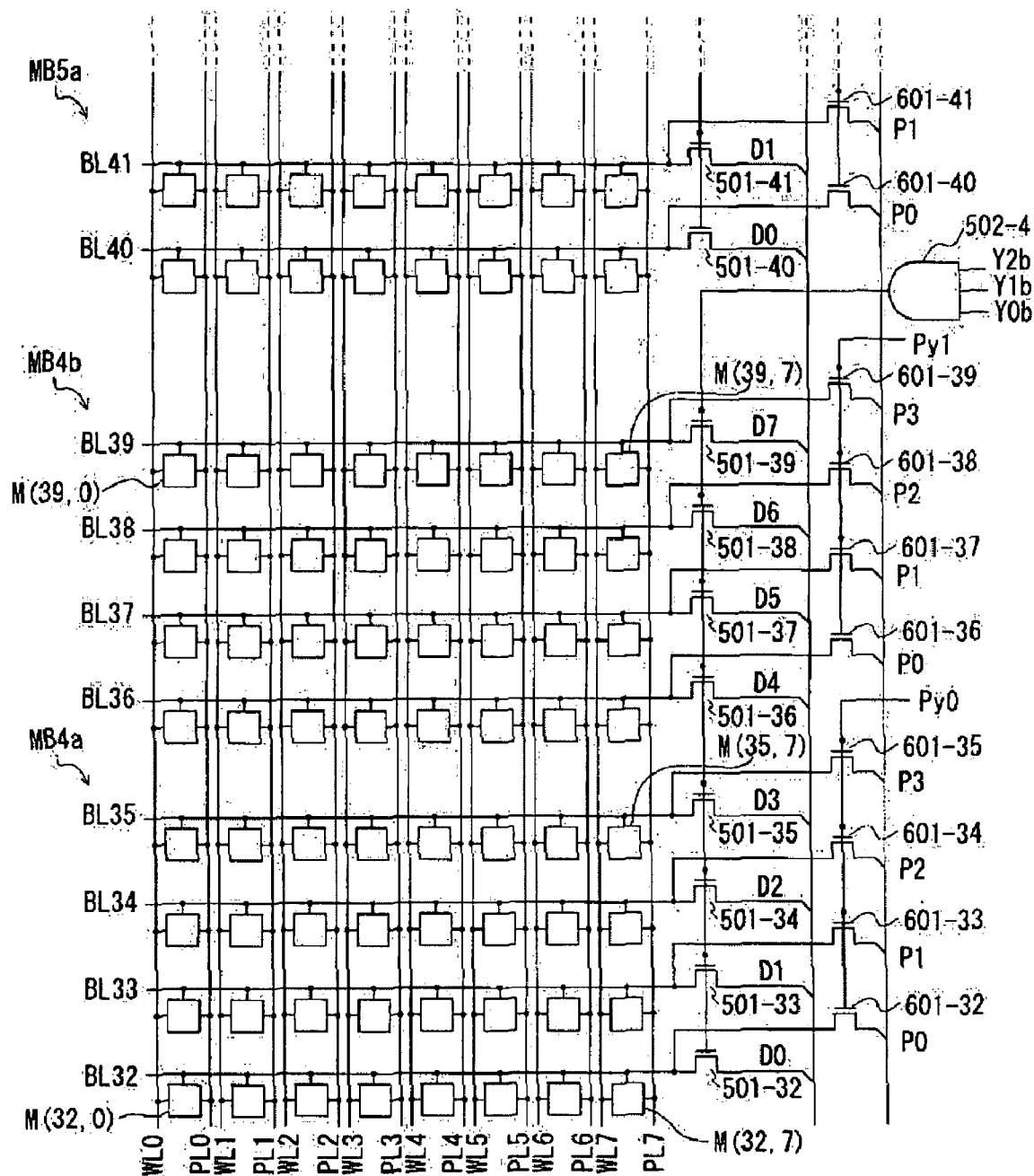
FIG. 6 is a circuit diagram depicting an essential configuration of the ferroelectric memory according to the second embodiment.
Figure 7:
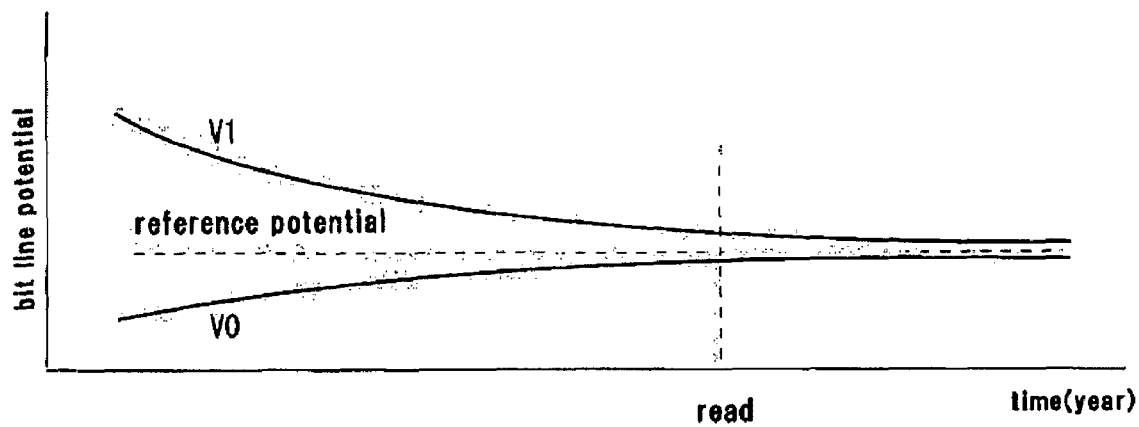
FIG. 7 is a conceptual diagram for describing the operation of a conventional ferroelectric memory.

FIGS. 4 through 6 are respectively circuit diagrams showing essential configurations of the ferroelectric memory according to the present embodiment. In FIG. 4, constituent elements marked with the same reference numerals as those shown in FIG. 1 are respectively identical to those shown in FIG. 1.

The ferroelectric memory 400 according to the present embodiment comprises a memory cell area 410 and AND circuits 421 through 424.

The memory cell area 410 includes six memory cell blocks MB0 through MB5. The memory cell blocks MB0 through MB5 has 8×8 memory cells M (0, 0) through M (47, 7) respectively (partly omitted in the figure). The respective memory cells are identical in configuration to those employed in the first embodiment. The memory cell block MB4 comprises two sub blocks MB4a and MB4b. Further, the memory cell block MB5 comprises two sub blocks MB5a and MB5b. Each of the sub blocks MB4a, MB4b, MB5a and MB5b has 8×4 memory cells. In the present embodiment as will be described later, the respective memory cells of the sub blocks MB4a, MB4b, MB5a and MB5b are used as 2T/2C type memory cells for parity bits (4 bits) when the memory cell blocks MB0 through MB3 corresponding to four stages from the bottom are used as the 2T/2C type.

The AND circuits 421 through 424 have one input terminals to which an ECC (Error-Correcting Code) enable signal ECCEN is inputted, and other input terminals from which any of control signals y0 through y3 is inputted. When the input signals are high in level together, the AND circuits 421 through 424 bring output signals Py0 through Py3 to a high level respectively. In the present embodiment, a signal SEL of an address comparator 150 is used as the ECC enable signal ECCEN as it is.

Gate transistors 501-0 through 501-47 (partly omitted in the figure) for data are connected to their corresponding bit lines BL0 through BL47 at one ends thereof and connected to their corresponding data lines D0 through D7 at other ends thereof.

The AND circuits 502-0 through 502-5 (partly omitted in the figure) are respectively inputted with three pairs of control signals (Y0b, Y0), (Y1b, Y1) and (Y2b, Y2) in increments of ones thereof from an unillustrated bit line driver. Only when the input signals are all high in level, the AND circuits 502-1 through 502-5 bring their outputs to a high level respectively. The outputs of the AND circuits 502-0 through 502-5 are applied to gate electrodes of the gate transistors 501-0 through 501-47 that belong to their corresponding memory cell blocks MB0 through MB5. In the memory cell blocks MB0 through MB3 corresponding to four stages from the bottom, the outputs of the AND circuits 502-0 through 502-3 are inputted to their corresponding AND circuits 421 through 424 as the control signals y0 through y3.

Gate transistors 601-32 through 601-47 for parity are provided only within the sub blocks MB4a, MB4b, MB5a and MB5b. The gate transistors 601-3 through 601-47 (partly omitted in the figure) are connected to their corresponding bit lines BL0 through BL47 at one ends thereof and connected to their corresponding parity bit lines P0 through P3 at the other ends thereof. Gate electrodes of the gate transistors 601-32 through 601-47 are supplied with the output signals Py0 through Py3 of their corresponding AND circuits 421 through 424.

The entire operation of the ferroelectric memory 100 according to the present embodiment will next be explained.

Even in the present embodiment, (ba2, ba1, ba0)=(1, 0, 0) are assumed to be stored in an address storage unit 140 as threshold memory addresses in advance.

The operation of the 1T/1C type memory cell will first be explained with each of the selected memory cells M (0, 0) through M (7, 0) taken as an example.

Column addresses (ea2, ea1 and ea0) are first inputted from outside. The address comparator 150 compares the column addresses with the threshold memory addresses (ba2, ba1 and ba0). Here, (ea2, ea1, ea0)=(0, 0, 0), and (ba2, ba1, ba0) (1, 0, 0). Accordingly, the column addresses are smaller than the threshold memory addresses. In this case, the address comparator 150 outputs a low level as the signal SEL. Thus, control signals (X0b, X0, X1b, X1, X2b, X2)=(1, 0, 1, 0, 1, 0) are outputted from an address switching unit 160 in a manner similar to the first embodiment. Accordingly, only a word line WL0 and a plate line PL0 are activated.

On the other hand, when row addresses are inputted from outside, an unillustrated bit line driver generates control signals (Y0b, Y0), (Y1b, Y1) and (Y2b, Y2), based on the row addresses. Here, assume that (Y0b, Y0, Y1b, Y1, Y2b, Y2)= (1, 0, 1, 0, 1, 0). Thus, only the AND circuit 502-0 of the AND circuits 502-1 through 502-5 in the memory cell blocks MB0 through MB5 outputs a high level. Accordingly, only the gate transistors 501-0 through 501-7 of the gate transistors 501-0 through 501-47 are turned on. Consequently, only the bit lines BL0 through BL7 are made conductive to their corresponding data lines D0 through D7, and other bit lines BL8 through BL47 are not made conductive to the data lines D0 through D7.

With the above operations, reading or writing is effected only on the memory cells M (0, 0) through M (0, 7) and not effected on other memory cells.

Incidentally, when the column addresses (ea2, ea1 and ea0) are smaller than the threshold memory addresses (ba2, ba1 and ba0), the signal SEL (i.e., ECC enable signal ECCN) becomes a low level, so the outputs of the AND circuits 421 through 424 are respectively brought to a low level. Accordingly, all the gate transistors 601-32 through 601-47 are turned off. Therefore, the bit lines BL32 through BL47 and the parity bit lines P0 through P3 are not brought into conduction. Thus, the memory cells lying within the memory cell blocks MB4 and MB5 can also be used as 1T/1C type memory cells for data storage in a manner similar to the memory cells lying within other memory cell blocks MB0 through MB4.

The operation of the 2T/2C type memory cell will next be explained with each of the selected memory cells M (0, 7) through M (7, 7) taken as an example.

Column addresses (ea2, ea1 and ea0) are first inputted from outside. The address comparator 150 compares the column addresses with the threshold memory addresses (ba2, ba1 and ba0). Here, (ea2, ea1, ea0)=(1, 1, 1), and (ba2, ba1, ba0)=(1, 0, 0). Thus, since the column addresses are larger than the threshold memory addresses, the address comparator 150 outputs a high level as the signal SEL. Accordingly, the control signals outputted from the address switching unit 160 result in (X0b, X0, X1b, X1, X2b, X2)=(1, 1, 0, 1, 0, 1) in a manner similar to the first embodiment. Therefore, word lines WL6 and WL7 and plate lines PL6 and PL7 are activated and others are deactivated.

In a manner similar to the above-described 1T/1C, row addresses are inputted from outside and control signals (Y0b, Y0, Y1b, Y1, Y2b, Y2)=(1, 0, 1, 0, 1, 0) are outputted from an unillustrated bit line driver. Accordingly, only the AND circuit 502-0 of the AND circuits 502-1 through 502-5 lying within the memory cell blocks MB0 through MB5 outputs a high level, so only the gate transistors 501-0 through 501-7 of the gate transistors 501-0 through 501-47 are turned on. Thus, only the bit lines BL0 through BL7 are made conductive to their corresponding data lines D0 through D7 and other bit lines BL8 through BL47 are not made conductive to the data lines D0 through D7.

As described above, the memory cells M (0, 7) through M (7, 7) are selected so that reading or writing is enabled.

When the signal SEL (i.e., ECC enable signal ECCEN) is brought to a high level and the output y0 of the AND circuit 502-0 is brought to a high level, the output signal Py0 of the AND circuit 421 is rendered high in level. Thus, since the gate transistors 601-32 through 601-35 are turned on, the parity bit lines P0 through P3 and the bit lines BL32 through BL35 are brought into conduction. Since the activated word and bit lines are of the word lines WL6 and WL7 and plate lines PL6 and PL7 alone as mentioned above, the parity bit lines P0 through P3 are made conductive to their corresponding ferroelectric capacitors (not shown) provided within the memory cells M (32, 6) through M (35, 6) and M (32, 7) through M (35, 7) of the sub block MB4a. In the case of data writing, parity values P0 through P3 outputted from an unillustrated error correcting circuit are written into the memory cells M (32, 6) through M (35, 6) and M (32, 7) through M (35, 7). In the case of data reading, the parity values P0 through P3 are read from the memory cells M (32, 6) through M (35, 6) and M (32, 7) through M (35, 7). On the other hand, since the signals y1 through y3 are maintained at the low level, reading or writing is not effected on other sub blocks MB4b through MB5b.

In the present embodiment as described above, when the column addresses are greater than the threshold memory addresses (1, 0, 0), the corresponding ferroelectric memory cells are used as the 2T/2C type memory cells and used in the sub blocks MB4a, MB4b, MB5b and MB5b as parity-value storage memory cells.

Incidentally, although the signal SEL is used as the ECC enable signal ECCEN as it is in the present embodiment, the ECC enable signal ECCEN may be generated independent of the signal SEL. Thus, the parity values can be stored even when each ferroelectric memory cell is of the 1T/1C type.

According to the present embodiment as described above, one memory block provided in one ferroelectric memory 100 can be used with being divided into the 1T/1C and 2T/2C types in a manner similar to the first embodiment. Further, there is no need to provide signal terminals for switching the 1T/1C type and the 2T/2C type.

According to the present embodiment as well, the parity values can be stored where the ferroelectric memory cells are used as the 2T/2C type memory cells. It is therefore possible to further enhance the reliability of storage of data over an extended period of time as compared with the first embodiment.

While the preferred forms of the present invention have been described, it is to be understood that modifications will be apparent to those skilled in the art without departing from the spirit of the invention. The scope of the invention is to be determined solely by the following claims.

What is claimed is:

1. A semiconductor memory device comprising:
   a memory cell array in which a plurality of memory cells each constituted of a capacitor and a transistor connected to the capacitor are arranged in matrix form;
   a plurality of word lines respectively connected to the memory cells disposed in a column direction;
   a plurality of bit line pairs respectively connected to the memory cells disposed in a row direction;
   a word line driver that selectively activates the word lines;
   an address storage unit that stores a threshold memory address that sets a first block of the memory cell array wherein each respective data of one bit are stored in respective ones of the memory cells of the first block, and that sets a second block of the memory cell array wherein each respective data of one bit are stored in respective pairs of the memory cells of the second block,
   an address comparing unit that determines whether each of memory addresses for specifying the memory cells to be accessed belongs to either of the first and second blocks by comparison with the threshold memory address stored in the address storage unit; and
   an address switching unit that controls the word line driver in such a manner that when it is determined that the memory address for specifying each memory cell to be accessed belongs to the first block, a corresponding one of the word lines in the first block is activated and when it is determined that the memory address belongs to the second block, a corresponding pair of the word lines in the second block is activated.

2. The semiconductor memory device according to claim 1, wherein the address storage unit stores therein a column address of the memory cell array as the threshold memory address, and the address comparing unit compares the column address with each of the memory addresses for specifying the memory cells to be accessed.

3. The semiconductor memory device according to claim 1, wherein the memory cells are ferroelectric memory cells,
   the semiconductor memory device further including a plate line driver which has a plurality of plate lines respectively connected to the memory cells disposed in the column direction and which activates the plate lines of a corresponding column only when the word lines of the corresponding column are activated.

4. The semiconductor memory device according to claim 2, wherein the memory cells are ferroelectric memory cells,
   the semiconductor memory device further including a plate line driver which has a plurality of plate lines respectively connected to the memory cells disposed in the column direction and which activates the plate lines of a corresponding column only when the word lines of the corresponding column are activated.

5. The semiconductor memory device according to claim 1, wherein when it is determined that the memory address for specifying each memory cell to be accessed belongs to the second block, other memory cell pairs lying within the second block are used as parity-value storage memory cells.

6. The semiconductor memory device according to claim 2, wherein when it is determined that the memory address for specifying each memory cell to be accessed belongs to the second block, other memory cell pairs lying within the second block are used as parity-value storage memory cells.

7. The semiconductor memory device according to claim 3, wherein when it is determined that the memory address for specifying each memory cell to be accessed belongs to the second block, other memory cell pairs lying within the second block are used as parity-value storage memory cells.

8. The semiconductor memory device according to claim 4, wherein when ills determined that the memory address for specifying each memory cell to be accessed belongs to the second block, other memory cell pairs lying within the second block are used as parity-value storage memory cells.

9. A semiconductor memory device comprising:
a memory cell array including a plurality of memory cells arranged in a matrix, each of the memory cells having a transistor and a capacitor connected to the transistor;
a word line driver that selectively drives word lines of the memory cell array;
an address storage unit that stores a threshold memory address that sets the memory cell array into a first block and a second block, wherein the memory cells in the first block are each designated for storing respective data of one bit and wherein the memory cells of the second block are designated for storing each respective data of one bit in a corresponding pair of the memory cells; and
a controller that compares an input memory address to be accessed with the threshold memory address to provide a comparison result, and that controls the word line driver to activate a single corresponding word line in the first block of the memory cell array when the input memory address corresponds to a memory cell in the first block and a corresponding pair of word lines in the second block of the memory cell array when the input memory address corresponds to a memory cell in the second block, responsive to the comparison result.

* * * * *